United States Patent

Hoshi et al.

(10) Patent No.: US 9,130,018 B2
(45) Date of Patent: Sep. 8, 2015

(54) PLASMA ETCHING METHOD AND STORAGE MEDIUM

(75) Inventors: Naotsugu Hoshi, Portland, OR (US); Noriyuki Kobayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 598 days.

(21) Appl. No.: 13/584,327

(22) Filed: Aug. 13, 2012

(65) Prior Publication Data

US 2012/0309203 A1  Dec. 6, 2012

Related U.S. Application Data

(62) Division of application No. 12/273,209, filed on Nov. 18, 2008, now Pat. No. 8,252,694.

(60) Provisional application No. 61/024,356, filed on Jan. 29, 2008.

(30) Foreign Application Priority Data

Nov. 19, 2007  (JP) .................................. 2007-299572

(51) Int. Cl.
*H01L 21/306* (2006.01)
*C23F 1/00* (2006.01)
*H01L 21/768* (2006.01)
*H01J 37/32* (2006.01)
*H01L 21/311* (2006.01)

(52) U.S. Cl.
CPC ..... *H01L 21/76813* (2013.01); *H01J 37/32926* (2013.01); *H01L 21/31116* (2013.01); *H01L 21/31138* (2013.01); *H01L 21/76807* (2013.01); *H01J 37/32091* (2013.01); *H01L 21/76814* (2013.01)

(58) Field of Classification Search
None
See application file for complete search history.

(56) References Cited

U.S. PATENT DOCUMENTS

| 7,015,135 B2 | 3/2006 | Hui et al. |
| 8,252,694 B2 | 8/2012 | Hoshi et al. |
| 2005/0026430 A1 | 2/2005 | Kim et al. |

FOREIGN PATENT DOCUMENTS

| JP | 2001-196455 | 7/2001 |
| JP | 2002-110644 | 4/2002 |
| JP | 2005-303191 | 10/2005 |
| JP | 2007-251044 | 9/2007 |

*Primary Examiner* — Maureen Passey
(74) *Attorney, Agent, or Firm* — Oblon, McClelland, Maier & Neustadt, L.L.P.

(57) ABSTRACT

A plasma etching method that can increase the selection ratio of a stop layer to an interlayer insulation film. The plasma etching method is carried out on a substrate that has the interlayer insulation film formed of CwFx (x and w are predetermined natural numbers) and a stop layer that stops etching and is exposed at the bottom of a hole or a trench formed in the interlayer insulation film. The interlayer insulation film and the stop layer are exposed at the same time to plasma generated from CyFz (y and z are predetermined natural numbers) gas and hydrogen-containing gas.

3 Claims, 4 Drawing Sheets

PLASMA ETCHING METHOD AND STORAGE MEDIUM

CROSS-REFERENCE TO RELATED APPLICATIONS

This application is a divisional application of U.S. application Ser. No. 12/273,209 filed Nov. 18, 2008 now U.S. Pat. No. 8,252,694, the entire contents of which is incorporated herein by reference. U.S. application Ser. No. 12/273,209 claims the benefit of priority under 119(e) of U.S. Provisional Application No. 61/024,356, filed Jan. 29, 2008, and claims the benefit of priority under 35 U.S.C. §119 from Japanese Patent Application No. 2007-299572 filed Nov. 19, 2007.

BACKGROUND OF THE INVENTION

1. Field of the Invention

The present invention relates to a plasma etching method and a storage medium, and more particularly to a plasma etching method in which a CwFx (x and w are predetermined natural numbers)-based low-dielectric insulating film and a stop layer that stops etching are exposed to plasma at the same time.

2. Description of the Related Art

In recent years, in a semiconductor device manufactured from a semiconductor wafer through a CVD process or plasma etching, a low-dielectric insulating film is used so as to lower parasitic capacitance due to insulation films between wires, and also, copper wiring is used so as to lower wiring resistance. In particular, as a low-dielectric insulating film, for example, a porous $SiO_2$ film, SiOC film, or SOG (Spin on Glass) film (for example, a film formed of hydrogen silsesquioxane (HSQ) or methyl silsesquioxane (MSQ)) is used.

A SiC layer or a SiCN layer is formed as a stop layer on copper wiring so as to prevent inadvertent etching of the copper wiring. When a via hole that reaches the copper wiring is to be formed, these stop layers are removed through etching. In etching of the stop layer, plasma generated from a mixed gas containing a fluorine compound gas (for example, $CF_4$ gas) has been conventionally used (see e.g. Japanese Laid-Open Patent Publication (Kokai) No. 2002-110644 and Japanese Laid-Open Patent Publication (Kokai) No. 2005-303191).

An SOG film is a film that is formed by coating a fluid material and ensures a low dielectric constant by increasing porosity, and therefore, the SOG film has the problem of having a low mechanical strength. Thus, in recent years, it has been considered that a CwFx-based organic film is used as a low-dielectric insulating film having a high mechanical strength.

However, if a CwFx-based organic film is used as a low-dielectric insulating film, when a stop layer such as a SiC layer is etched using plasma generated from $CF_4$ gas, the low-dielectric insulating film is etched at substantially the same etch rate as the etch rate at which the stop layer is etched. For this reason, there is the problem that the selection ratio of the stop layer to the low-dielectric insulating film cannot be increased, and hence the shapes (in particular, depths) of trenches formed in the low-dielectric insulating film cannot be properly adjusted.

SUMMARY OF THE INVENTION

The present invention provides a plasma etching method and a storage medium that can increase the selection ratio of a stop layer to an interlayer insulation film.

Accordingly, the first aspect of the present invention can provide a plasma etching method that is carried out on a substrate including an interlayer insulation film formed of CwFx (x and w are predetermined natural numbers) and a stop layer that stops etching, the stop layer being exposed at a bottom of a hole or a trench formed in the interlayer insulation film, comprising a stop layer etching step of exposing the interlayer insulation film and the stop layer at the same time to plasma generated from CyFz (y and z are predetermined natural numbers) gas and hydrogen-containing gas.

According to the first aspect of the present invention, the interlayer insulation film formed of CwFx (x and w are predetermined natural numbers) and the stop layer exposed at the bottom of the hole or the trench formed in the interlayer insulation film are exposed at the same time to plasma generated from the CyFz (y and z are predetermined natural numbers) gas and hydrogen-containing gas. When plasma (hydrogen plasma) generated from hydrogen-containing gas etches the interlayer insulation film comprised of CwFx, product is produced and accumulates as deposit on the interlayer insulation film, and hence etching of the low-dielectric insulating film is suppressed by the accumulated deposit. On the other hand, the product is unlikely to enter the via hole or the trench formed in the low-dielectric insulating film, and hence no deposit accumulates at the bottom of the hole or the trench. As a result, the etching of the stop layer exposed at the bottom of the hole or the trench is not suppressed. Thus, the selection ratio of the stop layer to the low-dielectric insulating film can be increased.

The first aspect of the present invention can provide a plasma etching method comprising an insulation film etching step of etching the interlayer insulation film prior to the stop layer etching step, wherein in the insulation film etching step, plasma generated from at least $O_2$ gas or $N_2$ gas is used.

According to the first aspect of the present invention, prior to the stop layer etching step, the interlayer insulation film is etched using plasma generated from at least $O_2$ gas or $N_2$ gas. Because the plasma generated from the $O_2$ gas or the $N_2$ gas selectively etches the interlayer insulation film comprised of CwFx, and hence the formation of the trench in the interlayer insulation film and the etching of the stop layer can be carried out in different steps, and as a result, the shape of the trench to be formed can be properly adjusted.

The first aspect of the present invention can provide a plasma etching method, wherein the stop layer comprises SiC or SiCN.

According to the first aspect of the present invention, because the stop layer is comprised of SiC or SiCN, the stop layer can be suitably etched by plasma generated from CyFz gas, and hence the selection ratio of the stop layer to the interlayer insulation film can be reliably increased.

The first aspect of the present invention can provide a plasma etching method, wherein the hydrogen-containing gas is at least one selected from a group consisting of $CH_3F$ gas, $CH_2F_2$ gas, and $CHF_3$ gas.

According to the first aspect of the present invention, because the hydrogen-containing gas is at least one selected from a group consisting of $CH_3F$ gas, $CH_2F_2$ gas, and $CHF_3$ gas, hydrogen plasma can be reliably generated, and as a result, product that is to accumulate as deposit on the interlayer insulation film can be reliably produced.

The first aspect of the present invention can provide a plasma etching method, wherein the hydrogen-containing gas is $CH_2F_2$ gas, and the CyFz gas is $CF_4$ gas, and a flow ratio of the $CH_2F_2$ gas to the $CF_4$ gas is equal to or larger than 3/7.

According to the first aspect of the present invention, because the flow ratio of the $CH_2F_2$ gas to the $CF_4$ gas is equal to or larger than 3/7, the selection ratio of the stop layer to the interlayer insulation film can be reliably increased.

The first aspect of the present invention can provide a plasma etching method, wherein the flow ratio of the $CH_2F_2$ gas to the $CF_4$ gas is equal to or larger than 1/1.

According to the first aspect of the present invention, because the flow ratio of the $CH_2F_2$ gas to the $CF_4$ gas is equal to or larger than 1/1, the selection ratio of the stop layer to the interlayer insulation film can be more increased.

The first aspect of the present invention can provide a plasma etching method, wherein the flow ratio of the $CH_2F_2$ gas to the $CF_4$ gas is equal to or larger than 7/3.

According to the first aspect of the present invention, because the flow ratio of the $CH_2F_2$ gas to the $CF_4$ gas is equal to or larger than 7/3, the selection ratio of the stop layer to the interlayer insulation film can be further increased.

The first aspect of the present invention can provide a plasma etching method, wherein the hydrogen-containing gas is $CHF_3$ gas, and the CyFz gas is $CF_4$ gas, and a flow ratio of the $CHF_3$ gas to the $CF_4$ gas is equal to or larger than 1/1.

According to the first aspect of the present invention, because the flow ratio of the $CHF_3$ gas to the $CF_4$ gas is equal to or larger than 1/1, the selection ratio of the stop layer to the interlayer insulation film can be reliably increased.

The first aspect of the present invention can provide a plasma etching method, wherein the flow ratio of the $CHF_3$ gas to the $CF_4$ gas is equal to or larger than 7/3.

According to the first aspect of the present invention, because the flow ratio of the $CHF_3$ gas to the $CF_4$ gas is equal to or larger than 7/3, the selection ratio of the stop layer to the interlayer insulation film can be more increased.

Accordingly, the second aspect of the present invention can provide a computer-readable storage medium storing a program for causing a computer to implement a plasma etching method that is carried out on a substrate that comprises an interlayer insulation film formed of CwFx (x and w are predetermined natural numbers) and a stop layer that stops etching, the stop layer being exposed at a bottom of a hole or a trench formed in the interlayer insulation film, wherein the plasma etching method comprises a stop layer etching step of exposing the interlayer insulation film and the stop layer at the same time to plasma generated from CyFz (y and z are predetermined natural numbers) gas and hydrogen-containing gas.

The features and advantages of the invention will become more apparent from the following detailed description taken in conjunction with the accompanying drawings.

BRIEF DESCRIPTION OF THE DRAWINGS

FIGS. 2A and 2B are schematic views of the construction of a semiconductor device formed on a wafer, to which is applied the plasma etching method according to the present embodiment, in which FIG. 2A is a plan view of the semiconductor device, and FIG. 2B is a cross-sectional view taken along line II-II in FIG. 2A;

DETAILED DESCRIPTION OF PREFERRED EMBODIMENTS

A preferred embodiment of the present invention will be described in detail below with reference to the drawings.

First, a description will be given of a substrate processing apparatus according to an embodiment of the present invention.

Figure 1:
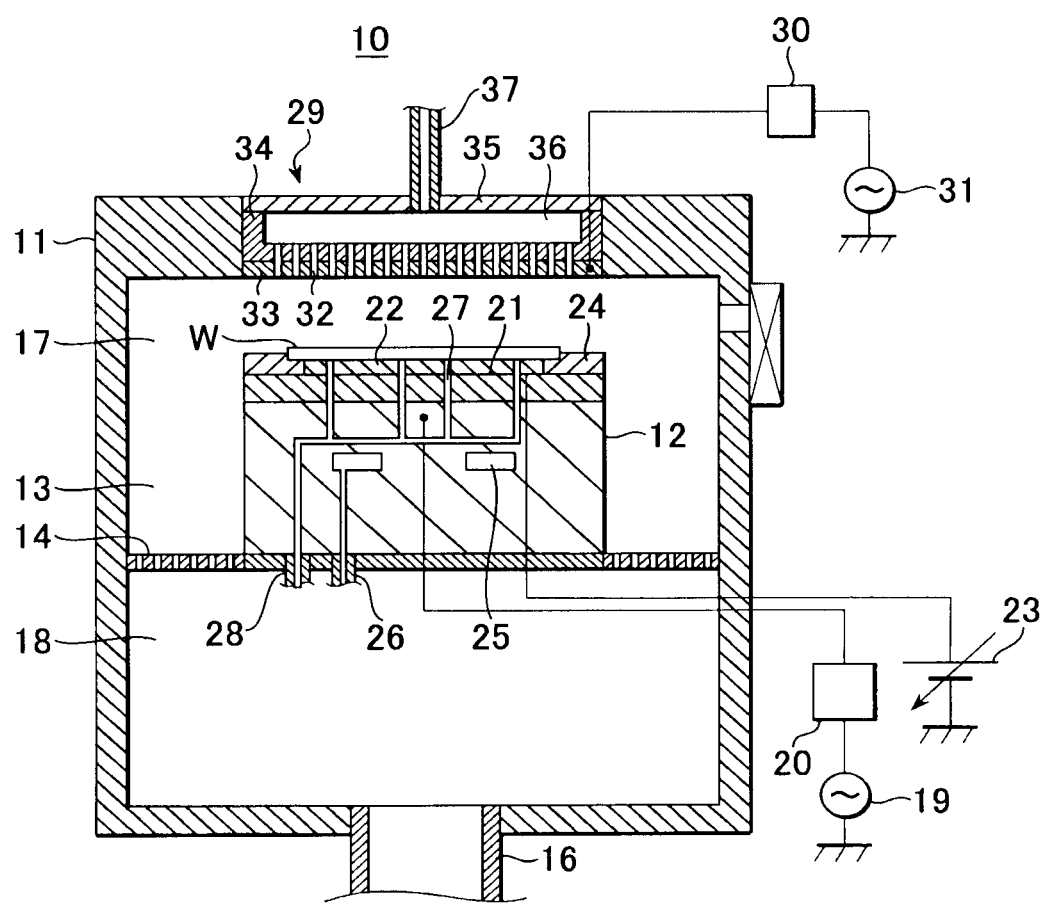
FIG. 1 is a schematic cross-sectional view showing the construction of a substrate processing apparatus that executes a plasma etching method according to an embodiment of the present invention.

FIG. 1 is a schematic cross-sectional view showing the construction of a substrate processing apparatus that executes the plasma etching method according to the present embodiment. The substrate processing apparatus is constructed such as to carry out plasma etching on a semiconductor wafer as a substrate.

Referring to FIG. 1, the substrate processing apparatus 10 has a chamber 11 that accommodates a wafer (hereinafter simply referred to as "the wafer") W having a diameter of e.g. 300 mm, and a cylindrical susceptor 12 on which the wafer W is placed is disposed in the chamber 11. In the substrate processing apparatus 10, the inner side wall of the chamber 11 and a side surface of the susceptor 12 define therebetween a side exhaust passage 13 functioning as a flow path for discharging gas above the susceptor 12 out of the chamber 11. An exhaust plate 14 is disposed in an intermediate portion of the exhaust passage 13.

The exhaust plate 14 is formed by a plate member formed with numerous holes, and functions as a partition plate for dividing the interior of the chamber 11 into an upper part and a lower part. Plasma is generated in the upper one (hereinafter referred to as "the reaction chamber") 17 of the parts into which the chamber 11 is partitioned by the exhaust plate 14. An evacuation pipe 16 for discharging gas in the chamber 11 is connected to the lower part (hereinafter referred to as "the evacuation chamber (manifold)") 18 of the chamber 11. The exhaust plate 14 catches or reflects plasma generated in the reaction chamber 17 to thereby prevent leakage of the plasma into the manifold 18.

A TMP (Turbo Molecular Pump) and a DP (Dry Pump) (both not shown) are connected to the evacuation pipe 16, and these pumps decompress the interior of the chamber 11 to a vacuum state. More specifically, the DP decompresses the interior of the chamber 11 from atmospheric pressure to an intermediate vacuum state (e.g. $1.3 \times 10$ Pa (0.1 Torr) or lower), while the TMP is cooperatively used with the DP to decompress the interior of the chamber 11 to a high vacuum state (e.g. $1.3 \times 10^{-3}$ Pa ($1.0 \times 10^{-5}$ Torr) or lower) lower than the intermediate vacuum state. It should be noted that the pressure in the chamber 11 is controlled by an APC valve (not shown).

A lower radio frequency power source 19 is connected to the susceptor 12 in the chamber 11 via a lower matcher 20, and the lower radio frequency power source 19 supplies predetermined radio-frequency electrical power to the susceptor 12. Thus, the susceptor 12 functions as a lower electrode. The lower matcher 20 reduces reflection of the high frequency electrical power from the susceptor 12 so as to maximize the efficiency of the supply of the radio frequency electrical power into the susceptor 12.

Disposed above the susceptor 12 is an electrostatic chuck 22 having an electrostatic electrode plate 21 therein. The electrostatic chuck 22 is formed by placing an upper disk-shaped member, which has a smaller diameter than a lower disk-shaped member having a certain diameter, over the lower disk-shaped member. It should be noted that the electrostatic chuck 22 is made of ceramic. When the wafer W is placed on the susceptor 12, the wafer W is disposed on the upper disk-shaped member of the electrostatic chuck 22.

A DC power supply 23 is electrically connected to the electrostatic electrode plate 21 of the electrostatic chuck 22. When a positive DC voltage is applied to the electrostatic electrode plate 21, a negative potential is generated on a surface (hereinafter referred to as "the rear surface") of the wafer W on the electrostatic chuck 22 side thereof, and therefore a potential difference is created between the electrostatic electrode plate 21 and the rear surface of the wafer W. As a result, the wafer W is held on the upper disk-shaped member of the electrostatic chuck 22 by attraction due to a Coulomb force or a Johnsen-Rahbek force generated by the potential difference.

Further, an annular focus ring 24 is mounted on the electrostatic chuck 22 in a manner enclosing the attracted and held wafer W. The focus ring 24, which is formed of e.g. silicon, converges plasma in the reaction chamber 17 toward a front surface of the wafer W to thereby enhance the efficiency of plasma etching.

Inside the susceptor 12 is formed an annular coolant chamber 25 extending e.g. along the circumference of the susceptor 12. A coolant, such as cooling water or a Galden (registered trademark) fluid, at a low temperature is supplied to the coolant chamber 25 for circulation therethrough from a chiller unit via a coolant pipe 26, not shown. The susceptor 12 cooled by the low-temperature coolant cools the wafer W and the focus ring 24 via the electrostatic chuck 22.

A plurality of heat transfer gas supply holes 27 are formed in a part (hereinafter referred to as the "holding surface") of the upper surface of the upper disk-shaped member of the electrostatic chuck 22 where the wafer W is held by attraction. The heat transfer gas supply holes 27 are connected to a heat transfer gas supply unit, not shown, via a heat transfer gas supply line 28, and the heat transfer gas supply unit supplies helium (He) gas as a heat transfer gas via the heat transfer gas supply holes 27 into a gap between the holding surface and the rear surface of the wafer W. The helium gas supplied into the gap between the holding surface and the rear surface of the wafer W effectively transfers heat of the wafer W to the electrostatic chuck 22.

A showerhead 29 is disposed in a ceiling of the chamber 11 in a manner opposed to the susceptor 12. An upper radio-frequency power supply 31 is connected to the showerhead 29 via an upper matcher 30, and the upper radio-frequency power supply 31 supplies predetermined radio-frequency power to the shower head 29. Thus, the showerhead 29 functions as an upper electrode. It should be noted that the upper matcher 30 has a function similar to the function of the lower matcher 20 described above.

The showerhead 29 has a ceiling electrode plate 33 having therein a number of gas holes 32, a cooling plate 34 that detachably suspends the ceiling electrode plate 33, and a cover member 35 that covers the cooling plate 34. A buffer chamber 36 is provided inside the cooling plate 34, and a process gas-introducing pipe 37 is connected to the buffer chamber 36. The showerhead 29 supplies a process gas supplied to the buffer chamber 36 through the process gas-introducing pipe 37 to the reaction chamber 17 through the gas holes 32. In the present embodiment, a mixed gas containing $CF_4$ gas (CyFz gas), $N_2$ gas, and $CH_2F_2$ gas (hydrogen-containing gas) is supplied as the process gas into the reaction chamber 17.

Moreover, the substrate processing apparatus 10 has a heating mechanism, not shown, that heats, for example, a side wall of the chamber 11.

In the substrate processing apparatus 10, radio-frequency electrical powers are supplied to the susceptor 12 and the showerhead 29 to apply high-frequency electrical power to the interior of the reaction chamber 17, whereby the process gas supplied from the showerhead 29 is turned into high-density plasma in the reaction chamber 17 to perform plasma etching on the wafer W.

Operation of the component parts of the substrate processing apparatus 10 described above is controlled by a CPU of a controller, not shown, provided in the substrate processing apparatus 10 in accordance with a program for plasma etching.

Figure 2A:
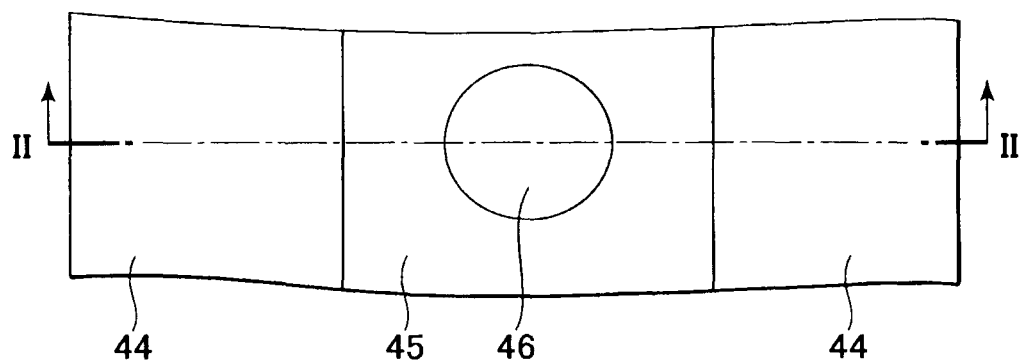
Figure 2B:
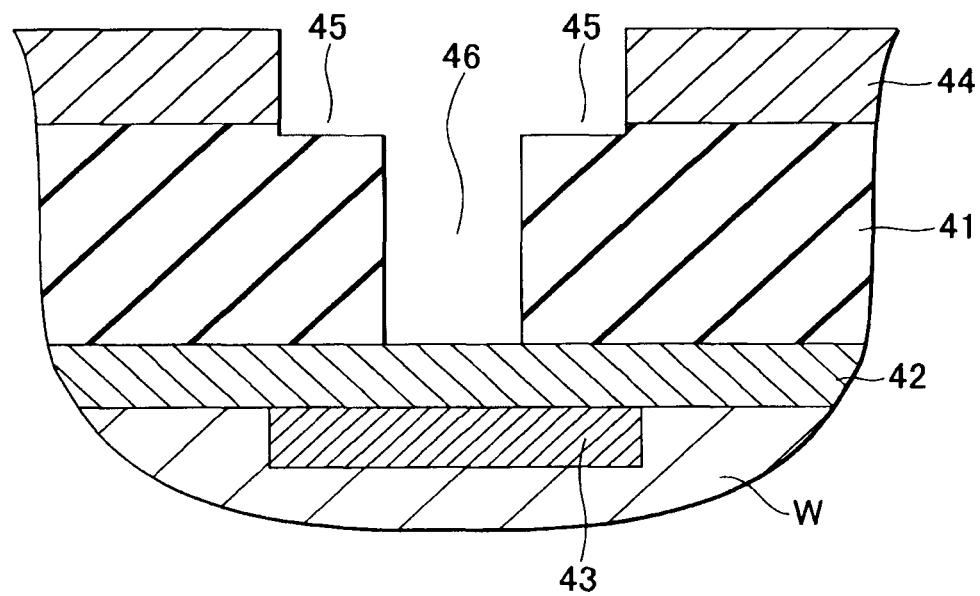

FIGS. 2A and 2B are schematic views of the construction of a semiconductor device formed on a wafer, to which is applied the plasma etching method according to the present embodiment, in which FIG. 2A is a plan view of the semiconductor device, and FIG. 2B is a sectional view taken along line II-II in FIG. 2A.

Referring to FIGS. 2A and 2B, the semiconductor device 40 has a low-dielectric insulating layer 41 comprised of CwFx (x and w are predetermined natural numbers) formed on a wafer W, a stop layer 42 comprised of SiC formed under the low-dielectric insulating layer 41, a copper wiring 43 covered with the etching stop layer 42, and a metal hard mask 44 formed according to a predetermined pattern on the low-dielectric insulating film 41 and containing Ti.

In the semiconductor device 40, through etching and the like prior to the plasma etching method according to the present embodiment, a relatively shallow trench 45 and a via hole 46 that passes through the low-dielectric insulating layer 41 are formed at the bottom of the trench 45. The etching stop layer 42 is exposed at the bottom of the via hole 46, and there is the copper wiring 43 under the etching stop layer 42.

In the present embodiment, when the stop layer 42 on the copper wiring 43 is removed to expose the copper wiring 43 at the bottom of the via hole 46 in the semiconductor device 40, the stop layer 42 is etched using plasma generated from a mixed gas containing $CF_4$ gas, $N_2$ gas, and $CH_2F_2$ gas, and at the same time, the low-dielectric insulating film 41 is also exposed to the plasma.

Figure 3:
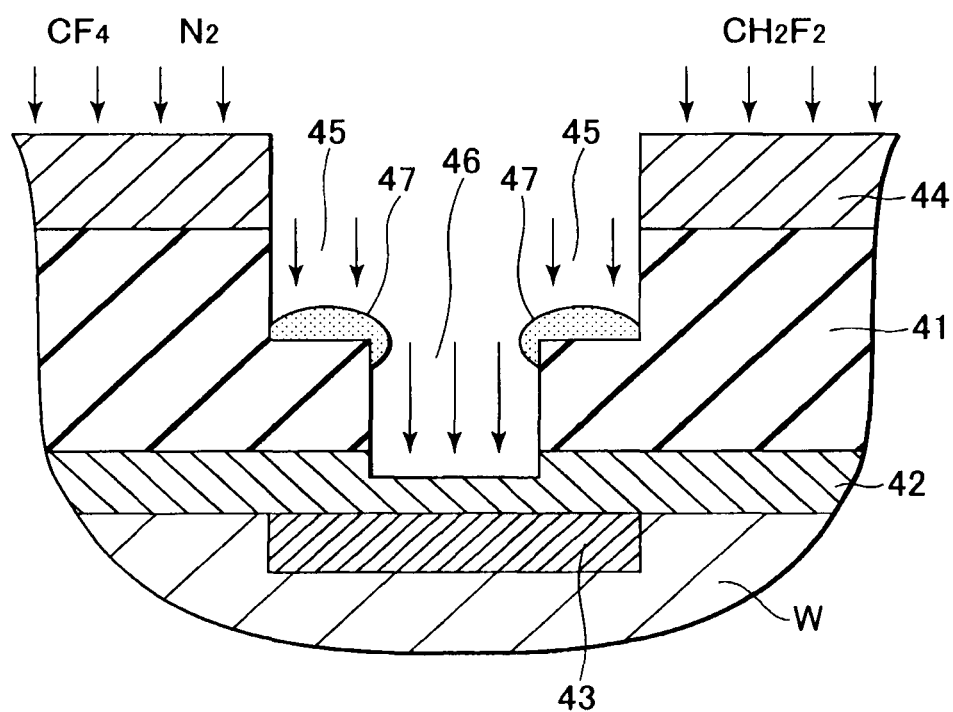
FIG. 3 is a cross-sectional view showing a process for removing a stop layer in the semiconductor device shown in FIG. 2.

Here, hydrogen plasma generated from a hydrogen-containing gas such as $CH_2F_2$ gas contacts CwFx constituting the low-dielectric insulating film 41, and at this time, the hydrogen plasma reacts with CwFx to produce product. The produced product accumulates as deposit 47 on the low-dielectric insulating layer 41, specifically, at the bottom of a trench 45, while the product is unlikely to enter the via hole 46, and hence the product does not accumulate as deposit at the bottom of the via hole 46 (see FIG. 3). As a result, the bottom of the via hole 46 (the stop layer 42) is etched by plasma generated from $CF_4$ gas, while the bottom of the trench 45 is covered with the deposit 47, and hence etching by plasma generated from the $CF_4$ gas is suppressed. Specifically, etching of the low-dielectric insulating film 41 is suppressed. Thus, in the present embodiment, the selection ratio of the stop layer 42 to the low-dielectric insulating film 41 is ensured.

Moreover, because it is known that plasma generated from $CH_2F_2$ gas efficiently etches SiC, the via hole 46 that reaches the copper wiring 43 can be quickly formed using the above-mentioned mixed gas.

Next, a description will be given of the plasma etching method according to the present embodiment.

FIGS. 4A to 4E are process diagrams illustrating a semiconductor device manufacturing process as the plasma etching method according to the present embodiment.

Figure 4A:
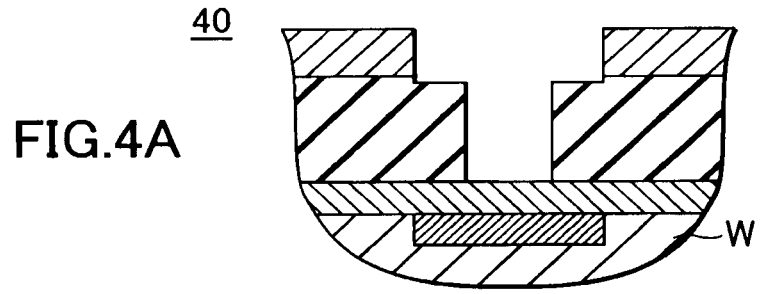
FIGS. 4A to 4E are process diagrams illustrating a semiconductor device manufacturing process as the plasma etching method according to the present embodiment.

First, a wafer W on which the semiconductor devices 40 are formed is prepared and loaded into the chamber 11 of the substrate processing apparatus 10, and the wafer W is mounted on the susceptor 12 (FIG. 4A).

Figure 4B:
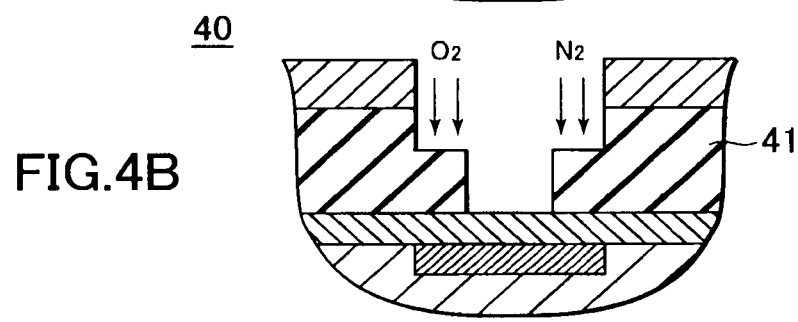

Next, a mixed gas containing $O_2$ gas, CO gas, and $N_2$ gas is supplied into the reaction chamber 17, and plasma is caused to be generated from the mixed gas. At this time, the plasma generated from the $O_2$ gas and the $N_2$ gas selectively etches an organic film, that is, the low-dielectric insulating film 41 (insulation film etching step) (FIG. 4B). Thus, only the depth of the trench 45 can be properly adjusted. Moreover, at this time, even if the plasma generated from the $O_2$ gas and the $N_2$ gas contacts CwFx of the low-dielectric insulating film 41, only a small amount of product is generated, and also, even if reaction product is produced, the reaction product is removed due to sputtering by the plasma. Thus, by using the plasma generated from the $O_2$ gas and the $N_2$ gas, the low-dielectric insulating film 41 can be selectively etched to quickly form the trench 45.

Figure 4C:
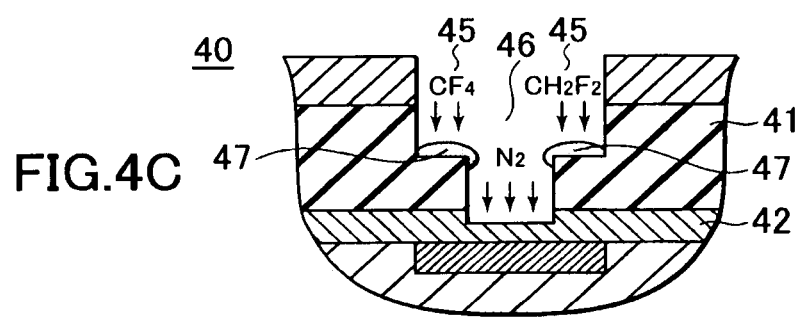
Figure 4D:
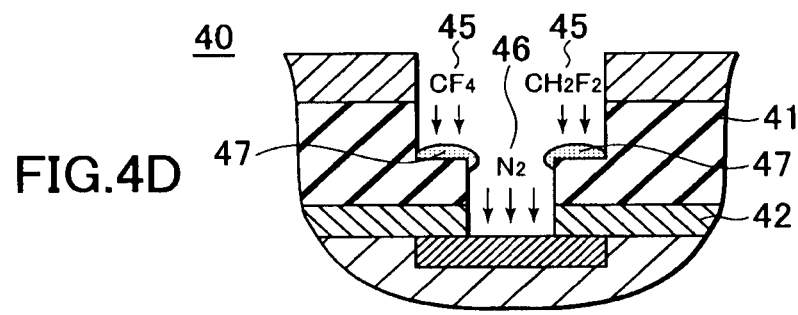
Figure 4E:
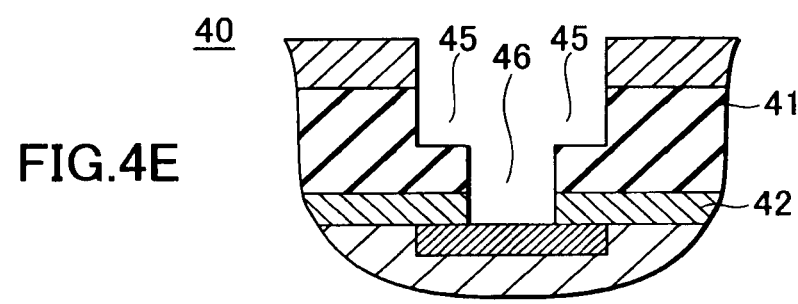

Next, a mixed gas containing $CF_4$ gas, $N_2$ gas, and $CH_2F_2$ gas is supplied into the reaction chamber 17 so that plasma is caused to be generated from the mixed gas, and the stop layer 42 at the bottom of the via hole 46 is etched by the plasma (stop layer etching step) (FIG. 4C). At this time, as described above, product accumulates as the deposit 47 at the bottom of the trench 45, while no deposit accumulates at the bottom of the via hole 46. Thus, even if the etching using the plasma generated from the mixed gas containing the $CF_4$ gas, the $N_2$ gas, and the $CH_2F_2$ gas is continued, the etching of the low-dielectric insulating film 41 is suppressed, and hence the trench 45 can be prevented from becoming excessively deep. On the other hand, the etching of the stop layer 42 is not suppressed, only the depth of the via hole 46 can be properly adjusted, and as a result, the via hole 46 passing through the stop layer 42 can be reliably formed (FIG. 4D).

Thereafter, the wafer W is taken out of the chamber 11 and loaded into a cleaning apparatus (not shown), the cleaning apparatus removes the deposit 47 accumulated at the bottom of the trench 45 (FIG. 4E), and then the process is brought to an end.

According to the semiconductor device manufacturing process in FIGS. 4A to 4E, the low-dielectric insulating film 41 comprised of CwFx and the stop layer 42 exposed at the bottom of the via hole 46 formed in the low-dielectric insulating film 41 are exposed at the same time to plasma generated from a mixed gas containing $CF_4$ gas, $N_2$ gas, and $CH_2F_2$ gas. When hydrogen plasma generated from hydrogen-containing gas contacts CwFx, product is produced and accumulates as the deposit 47 at the bottom of the trench 45, and hence etching of the low-dielectric insulating film 41 is suppressed by the accumulated deposit 47. On the other hand, the product is unlikely to enter the via hole 46 formed in the low-dielectric insulating film 41, and hence no product accumulates at the bottom of the via hole 46. As a result, the etching of the stop layer 42 exposed at the bottom of the via hole 46 is not suppressed. Thus, the etching selection ratio of the stop layer 42 to the low-dielectric insulating film 41 can be increased.

In the above described semiconductor device manufacturing process in FIG. 4, prior to the etching of the stop layer 42, the low-dielectric insulating film 41 is etched using plasma generated from $O_2$ gas and $N_2$ gas. Because the plasma generated from the $O_2$ gas and the $N_2$ gas selectively etches the low-dielectric insulating film 41 comprised of CwFx, the formation of the trench 45 in the low-dielectric insulating film 41 and the etching of the stop layer 42 can be carried out in different steps, and as a result, the shape of the trench 45 to be formed can be properly adjusted.

In the above described semiconductor device 40, because the stop layer 42 is SiC and thus can be suitably etched by plasma generated from $CF_4$ gas, and as a result, the selection ratio of the stop layer 42 to the low-dielectric insulating film 41 can be reliably increased.

Further, in the above described semiconductor device manufacturing process in FIGS. 4A to 4E, because the mixed gas used for etching of the stop layer 42 contains $CH_2F_2$ gas, hydrogen plasma can be reliably generated, and as a result, product that is to accumulate as the deposit 47 on the trench 45 can be reliably produced.

Further, in the above described semiconductor device manufacturing process in FIGS. 4A to 4E, the mixed gas used for etching of the stop layer 42 contains $CH_2F_2$ gas as the hydrogen-containing gas, the mixed gas may contain $CH_3F$ gas or $CHF_3$ gas, and in this case as well, hydrogen plasma can be reliably produced.

Further, although in the above described semiconductor device manufacturing process in FIG. 4, a mixed gas used for selective etching of the low-dielectric insulating film 41 contains both $O_2$ gas and $N_2$ gas, the mixed gas may contain only $O_2$ gas or $N_2$ gas, plasma generated from only the $O_2$ gas or the $N_2$ gas also selectively etches the low-dielectric insulating film 41.

Moreover, although in the above described semiconductor device 40, the stop layer 42 is formed of SiC, the stop layer 42 may be formed of SiCN, and plasma generated from $CF_4$ gas etches SiCN as well.

In the present embodiment, when the stop layer 42 is etched by plasma generated from $CF_4$ gas, the bottom of the trench 45 formed in the low-dielectric insulating film 41 is covered with the deposit 47, but because the side of the trench 45 is not covered with the deposit 47, the low-dielectric insulating film 41 may be exposed to plasma generated from $CF_4$ gas. At this time, the stop layer 42 is removed, and the copper wiring 43 exposes itself and is exposed to plasma generated from $CF_4$ gas, CwFx is decomposed by the plasma, and a large amount of C flies apart. On the other hand, the copper wiring 43 exposed at the bottom of the via hole 46 is sputtered, and Cu flies apart. The large amount of C and Cu flying apart combine together to produce a large amount of reaction product, and then the produced reaction product may be attached as residues to the bottoms and sides of the via holes 46 and the trenches 45.

In this case, it is proffered that $N_2$ gas or $O_2$ gas are added to a mixed gas used for etching of the stop layer 42. Specifically, the flow rate of $N_2$ gas or $O_2$ gas in the mixed gas is higher than the flow rate of $CF_4$ gas, and more specifically, it is preferred that the flow ratio of $CF_4$ gas to $N_2$ gas (or $O_2$ gas) in the mixed gas is expressed by $CF_4$ gas:$N_2$ gas (or $O_2$ gas)=1:X (where, X≥7). Plasma generated from a large amount of supplied $N_2$ gas or $O_2$ gas facilitates decomposition and sputtering of reaction product and prevents residues from becoming attached to the bottoms and sides of the via holes 46 and the trenches 45.

Moreover, in the present embodiment, $CF_4$ gas is used as a fluorocarbon-based gas (CyFz (y and z are predetermined natural numbers) gas), the fluorocarbon-based gas included in the process gas is not limited to this, but may be, for example, $C_4F_8$, $C_2F_6$, $C_3F_8$, $C_4F_6$, or $C_5F_8$. Also, if $CHF_3$ as a hydrogen-containing gas or $NF_3$ or $SF_6$ as a non-hydrogen-containing gas is used, the same effects as those of the present invention can be expected to be obtained.

Further, in the above described embodiment, it is preferred that the temperature of atmosphere is low when the semiconductor device manufacturing process in FIG. 4 is carried out. If the temperature of atmosphere is low, etching of SiC and SiCN by plasma generated from $CF_4$ gas is facilitated. As a result, the selection ratio of the stop layer 42 to the low-dielectric insulating film 41 can be reliably increased.

Further, it is to be understood that the object of the present invention may also be accomplished by supplying a computer with a storage medium in which a program code of software, which realizes the functions of the above described embodiment is stored, and causing a CPU of the computer to read out and execute the program code stored in the storage medium.

In this case, the program code itself read from the storage medium realizes the functions of the above described embodiment, and hence the program code and the storage medium on which the program code is stored constitute the present invention.

Examples of the storage medium for supplying the program code include a medium capable of storing the above program code, for example, a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program code may be supplied by downloading from another computer, a database, or the like, not shown, connected to the Internet, a commercial network, a local area network, or the like.

Further, it is to be understood that the function of the above described embodiment may be accomplished not only by executing a program code read out by a computer, but also by causing an OS (an operating system) or the like which operates on a CPU to perform a part or all of the actual operations based on instructions of the program code.

Further, it is to be understood that the functions of the above described embodiment may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program code may be an object code, a program code executed by an interpreter, or a script data supplied to an OS.

Next, examples of the present invention will be described.

EXAMPLES 1 TO 3

First, the inventors of the present invention prepared a wafer W on which the semiconductor device 40 was formed, carried out the semiconductor device manufacturing process in FIGS. 4A to 4E on the semiconductor device 40 using the substrate processing apparatus 10, measured the selection ratio of the stop layer 42 to the low-dielectric insulating film 41 in etching of the stop layer 42 at a plurality of locations on the wafer W, and indicated average values (hereinafter referred to as "average selection ratio") of the measured selection ratios in the following Table 1. In this case, the flow rate of $CH_2F_2$ gas/$CF_4$ gas used in etching of the stop layer 42 was 15/35 sccm (the flow ratio of $CH_2F_2$ gas to $CF_4$ gas was 3/7) in the example 1, 25/25 sccm (the flow ratio of $CH_2F_2$ gas to $CF_4$ gas was 1/1) in the example 2, and 35/15 sccm (the flow ratio of $CH_2F_2$ gas to $CF_4$ gas was 7/3) in the example 3.

COMPARATIVE EXAMPLE 1

Next, as is the case with the Examples 1 to 3, the present inventors carried out the semiconductor device manufacturing process in FIGS. 4A to 4E on the semiconductor device 40, measured the average selection ratios of the stop layer 42 to the low-dielectric insulating film 41 in etching of the stop layer 42, and indicated the measured average selection ratios in the following Table 1. In this case, the flow rate of $CH_2F_2$ gas/$CF_4$ gas used in etching of the stop layer 42 was 0/50 sccm (the flow ratio of $CH_2F_2$ gas to $CF_4$ gas was 0).

TABLE 1

|  | EXAMPLE 1 | EXAMPLE 2 | EXAMPLE 3 | COMPARATIVE EXAMPLE 1 |
|---|---|---|---|---|
| $CH_2F_2$ (sccm) | 15 | 25 | 35 | 0 |
| $CF_4$ (sccm) | 35 | 25 | 15 | 50 |
| AVERAGE SELECTION RATIO | 15 | 24 | 26 | 1 |

EXAMPLES 4 AND 5

First, in each of the examples 4 and 5, the present inventors carried out the semiconductor device manufacturing process on the semiconductor device 40 under the same conditions as those in the examples 1 to 3 except that a mixed gas containing $CF_4$ gas, $N_2$ gas, and $CHF_3$ gas was used as a process gas, measured the average selection ratios of the stop layer 42 to the low-dielectric insulating film 41 in etching of the stop layer 42, and indicated the measured average selection ratios in the following Table 2. In this case, the flow rate of $CHF_3$ gas/$CF_4$ gas used in etching of the stop layer 42 was 25/25 sccm (the flow ratio of $CHF_3$ gas to $CF_4$ gas was 1/1) in the example 4, and 35/15 sccm (the flow ratio of $CHF_3$ gas to $CF_4$ gas was 7/3) in the example 5.

COMPARATIVE EXAMPLE 2

Next, as is the case with the examples 4 and 5, the inventors of the present invention carried out the semiconductor device manufacturing process on the semiconductor device 40, measured the average selection ratios of the stop layer 42 to the low-dielectric insulating film 41 in etching of the stop layer 42, and indicated the measured average selection ratios in the following Table 2. In this case, the flow rate of $CHF_3$ gas/$CF_4$ gas used in etching of the stop layer 42 was 0/50 sccm (the flow ratio of $CHF_3$ gas to $CF_4$ gas was 0).

TABLE 2

|  | EXAMPLE 4 | EXAMPLE 5 | COMPARATIVE EXAMPLE 2 |
|---|---|---|---|
| $CHF_3$ (sccm) | 25 | 35 | 0 |
| $CF_4$ (sccm) | 25 | 15 | 50 |
| AVERAGE SELECTION RATIO | 3 | 4 | 1 |

Referring to Tables 1 and 2, first, it was found that if $CH_2F_2$ gas or $CHF_3$ gas is included in a mixed gas, etching of the low-dielectric insulating film 41 is suppressed, and as a result, the selection ratio of the stop layer 42 to the low-dielectric insulating film 41 can be ensured. Also, it was found that as the flow rate of $CH_2F_2$ gas or $CHF_3$ gas in the mixed gas is increased, the selection ratio of the stop layer 42 to the low-dielectric insulating film 41 can be increased.

Further, as a result of comparison between the case where $CH_2F_2$ gas as a hydrogen-containing gas is used (examples 1 to 3) and the case where $CHF_3$ gas is used (examples 4 and 5), it was estimated that if a hydrogen-containing gas containing a large amount of hydrogen atoms is used, a larger amount of hydrogen plasma is produced to further suppress etching of the low-dielectric insulating film 41 because the selection ratio is higher at the same flow rate in the case where $CH_2F_2$ gas is used.

EXAMPLE 6

Moreover, the present inventors prepared another wafer W on which the semiconductor device 40 was formed, carried out the semiconductor device manufacturing process in FIGS. 4A to 4E on the semiconductor device 40 using the substrate processing apparatus 10, and analyzed components of the low-dielectric insulating film 41, specifically, the amounts of various molecules constituting the low-dielectric insulating film 41 by Thermal Desorption Spectroscopy.

COMPARATIVE EXAMPLE 3

Next, as is the case with the example 6, the present inventors prepared another wafer W on which the semiconductor device 40 was formed, and carried out the semiconductor device manufacturing process on the semiconductor device 40 using the substrate processing apparatus 10. The conditions of the semiconductor device manufacturing process was carried out were the same as those in the conditions of the semiconductor device manufacturing process in FIGS. 4A to 4E except that a mixed gas that contained only $CF_4$ gas and $N_2$ gas and did not contain $CH_2F_2$ gas was used in etching of the stop layer 42. After that, components of the low-dielectric insulating film 41 were analyzed by Thermal Desorption Spectroscopy.

As a result of comparison between the analysis results of the example 6 and the analysis results of the comparative example 3, it was found that the components of the low-dielectric insulating film 41 in the example 6 were the same as those of the low-dielectric insulating film 41 in the comparative example 3. Also, it is conventionally known that even if the stop layer 42 is etched using a mixed gas that contains only $CF_4$ gas and $N_2$ gas, the components of the low-dielectric insulating film 41 do not change. It was thus found that the components of the low-dielectric insulating film 41 does not change even if the stop layer 42 is etched via the via hole 46 passing through the low-dielectric insulating film 41 using hydrogen-containing gas such as $CH_2F_2$ gas.

What is claimed is:

1. A substrate processing apparatus, comprising:
    a chamber that accommodates a substrate including a mask layer, an interlayer insulation film formed of CwFx (x and w are predetermined natural numbers) and a stop layer that stops etching when the interlayer insulation film is etched and contains at least Si and C;
    a mounting stage on which said substrate is mounted;
    a gas supply unit that supplies a first mixed gas including at least $O_2$ gas and $N_2$ gas and a second mixed gas including CyFz (y and z are predetermined natural numbers) gas and gas containing C, H and F into said chamber;
    a radio-frequency power supply that supplies, into said chamber, radio-frequency power to generate first plasma from the first mixed gas and second plasma from the second mixed gas, respectively; and
    a control unit configured to control a plasma etching performed on said substrate so that a first trench is formed by causing said gas supply unit to supply the first mixed gas into said chamber, generating first plasma from the supplied first mixed gas by the radio-frequency power supplied from said radio-frequency power supply and selectively etching the interlayer insulation film by the first plasma using the mask layer as a mask, and a second trench is formed subsequently to the first trench by causing said gas supply unit to supply the second mixed gas into said chamber, generating second plasma from the supplied second mixed gas by the radio-frequency power supplied from said radio-frequency power supply and selectively etching the stop layer by the second plasma using the interlayer insulation film as a mask,
    wherein said control unit controls the plasma etching so that the stop layer is etched, wherein increasing a flow ratio of the gas containing C, H and F to the CyFz gas increases a selection ratio of the stop layer to the interlayer insulation film.

2. A substrate processing apparatus according to claim 1, wherein said control unit controls a flow ratio of the gas containing C, H and F to the CyFz gas in a range from 0.4 to 2.3.

3. A non-transitory computer-readable storage medium storing a program for causing a computer to implement a plasma etching method for a substrate processing apparatus, the method comprising:
    preparing, in a chamber, a substrate including a mask layer, an interlayer insulation film formed of CwFx (x and w are predetermined natural numbers) and a stop layer that stops etching when the interlayer insulation film is etched and contains at least Si and C;
    forming a first trench by selectively etching the interlayer insulation film using the mask layer as a mask by plasma generated from a first mixed gas including at least $O_2$ gas and $N_2$ gas; and
    forming a second trench subsequently to the first trench by selectively etching the stop layer by plasma generated from a second mixed gas including CyFz (y and z are predetermined natural numbers) gas and gas containing C, H and F using the interlayer insulation film as a mask,
    wherein in etching the stop layer, increasing a flow ratio of the gas containing C, H and F to the CyFz gas increases a selection ratio of the stop layer to the interlayer insulation film.

* * * * *